United States Patent
Choi et al.

(10) Patent No.: US 8,993,445 B2
(45) Date of Patent: Mar. 31, 2015

(54) SELECTIVE REMOVAL OF GATE STRUCTURE SIDEWALL(S) TO FACILITATE SIDEWALL SPACER PROTECTION

(71) Applicant: GLOBALFOUNDRIES, Inc., Grand Cayman (KY)

(72) Inventors: Dae-Han Choi, Loudonville, NY (US); Dae Geun Yang, Watervliet, NY (US); Chang Ho Maeng, Clifton Park, NY (US); Wontae Hwang, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 54 days.

(21) Appl. No.: 13/740,343

(22) Filed: Jan. 14, 2013

(65) Prior Publication Data

US 2014/0199845 A1    Jul. 17, 2014

(51) Int. Cl.
  *H01L 21/302*   (2006.01)
  *H01L 21/461*   (2006.01)
  *H01L 21/311*   (2006.01)
  *B44C 1/22*     (2006.01)
  *C25F 3/00*     (2006.01)
  *C03C 15/00*    (2006.01)
  *C03C 25/68*    (2006.01)
  *C23F 1/00*     (2006.01)
  *H01L 29/40*    (2006.01)

(52) U.S. Cl.
  CPC .................................. *H01L 29/401* (2013.01)
  USPC ........... 438/696; 438/689; 438/706; 438/735; 216/37; 216/46; 216/67; 216/11

(58) Field of Classification Search
  None
  See application file for complete search history.

(56) References Cited

U.S. PATENT DOCUMENTS

2005/0233525 A1* 10/2005 Yeo et al. ...................... 438/283
2006/0008973 A1*  1/2006 Phua et al. .................... 438/231
2008/0079060 A1*  4/2008 Zhu .............................. 257/321

OTHER PUBLICATIONS

Winters et al., "Influence of Doping on the Etching of Si (111)", Phys. Rev. B 36, 6613-6623 (1987) (Abstract Only).
Spinella et al., "Selective Etching of B-Doped Silicon: Mechanisms and Two-Dimensional Delineation of Concentration Profiles", J. Electrochemical Society, vol. 142, Issue 5, pp. 1601-1607 (1995) (Abstract Only).

* cited by examiner

*Primary Examiner* — Stephanie Duclair
(74) *Attorney, Agent, or Firm* — Kevin P. Radigan, Esq.; Heslin Rothenberg Farley & Mesiti P.C.

(57) ABSTRACT

Methods are provided for facilitating fabricating a semiconductor device by selectively etching a gate structure sidewall(s) to facilitate subsequent sidewall spacer isolation. The method includes, for instance: providing a gate structure with a protective layer(s) over the gate structure, the gate structure including one or more sidewalls; selectively removing a portion of the gate structure along at least one sidewall to partially undercut the protective layer(s); and forming a sidewall spacer(s) over the sidewall(s) of the gate structure, with a portion of the sidewall spacer at least partially filling the partial undercut of the protective layer(s), and residing below the protective layer(s). In certain embodiments, the selectively removing includes implanting the sidewall(s) with a dopant to produce a doped region(s) of the gate structure, and subsequently, at least partially removing the doped region(s) of the gate structure selective to an undoped region of the gate structure.

20 Claims, 3 Drawing Sheets

SELECTIVE REMOVAL OF GATE STRUCTURE SIDEWALL(S) TO FACILITATE SIDEWALL SPACER PROTECTION

FIELD OF THE INVENTION

The present invention relates to semiconductor devices and methods of fabricating semiconductor devices, and more particularly, to methods of fabricating gate structures for semiconductor devices.

BACKGROUND OF THE INVENTION

A finished gate structure (such as a finished gate or transistor gate) is the transistor terminal that modulates channel conductivity. Two principle approaches for forming semiconductor device gate structures are the gate-first and gate-last process approaches.

During fabrication of gate structures for, for instance, complementary metal-oxide-semiconductor (CMOS) technology, gate-first fabrication has traditionally been employed. In a gate-first fabrication approach, a conductor is provided over a gate dielectric, and then patterned (i.e., etched) to form one or more gate structures. After forming the gate structures, source and drain features of the semiconductor devices are provided.

More recently, the gate-last approach (or replacement metal gate (RMG) approach), has been employed. In the gate-last approach, a sacrificial (or dummy) gate material is provided and patterned (i.e., etched) to define one or more sacrificial gates. The one or more sacrificial gates are subsequently replaced with, for instance, a metal gate, after source and drain features of the devices have been formed. The sacrificial gate material holds the position for the subsequent metal gate to be formed. For instance, an amorphous silicon (a-Si) or polysilicon sacrificial gate may be patterned and used during initial processing until high-temperature annealing to activate the source and drain features has been completed. Subsequently, the a-Si or polysilicon may be removed and replaced with the final metal gate.

Although beneficial in certain aspects, conventional gate-last processing may be susceptible to silicon nodule defect formation on the sacrificial gate(s) during a subsequent epitaxial growth, for instance, on the fins to facilitate stressing the respective gate channels of the semiconductor structures being formed, referred to in the art as "FINFETs". The FIN-FET takes its name from the multiple fins that form the respective gate channels of the field-effect transistors (FETs). This silicon nodule defect formation may be problematic, particularly as critical dimensions become smaller.

BRIEF SUMMARY

The shortcomings of the prior art are overcome and additional advantages are provided through the provision, in one aspect, of a method which includes, for instance, facilitating fabricating a semiconductor device by: providing a gate structure with at least one layer over the gate structure, the gate structure including at least one sidewall; selectively removing a portion of the gate structure along the at least one sidewall to partially undercut the at least one layer over the gate structure; and forming at least one sidewall spacer over the at least one sidewall of the gate structure, wherein a portion of the at least one sidewall spacer at least partially fills the partial undercut of the at least one layer, and resides at least partially below the at least one layer.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

As noted above, conventional gate-last processing may be susceptible to silicon nodule defect formation from the sacrificial gate(s) during, for instance, a subsequent epitaxial growth on the fins used to facilitate defining (e.g., stressing) the respective gate channels of a semiconductor structure, such as a FINFET. FIGS. 1A-1D depict one example of this problem.

Figure 1A:
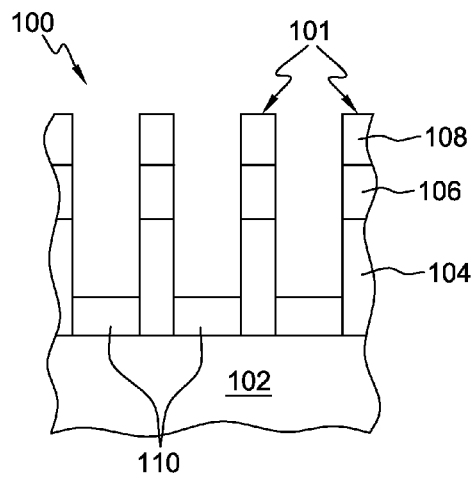
FIG. 1A is a partial elevational view of one example of an intermediate structure obtained during a gate-last semiconductor device fabrication approach of a conventional FIN-FET.

Referring to FIG. 1A, a partial side elevational view of an intermediate structure obtained during gate-last fabrication of a semiconductor device, such as a semiconductor device comprising multiple FINFETs, is depicted. Intermediate structure 100 includes a substrate 102, such as a semiconductor substrate, and one or more fins 110 disposed on or projecting from the substrate. Multiple gate structures 104 are illustrated, which in one embodiment may be sacrificial gate structures residing above substrate 102 and extending over fins 110 in an intermediate stage of a gate-last semiconductor device fabrication approach. In this example, one or more protective layers may reside over the respective sacrificial gate structures 104. These protective layers may include, for instance, a first hard mask layer 106 and a second hard mask layer 108, and be disposed over respective gate structures 104 in multiple gate stacks 101. The various layers and structures of FIG. 1A may be formed using a variety of different materials, and a variety of fabrication techniques, such as chemical-vapor deposition (CVD), atomic layer deposition (ALD), physical vapor deposition (PVD), or plasma-enhanced versions of such processes. The thicknesses of the depicted structures and layers may also vary, depending upon the particular application.

By way of example, substrate 102 may be a silicon substrate, and gate structure 104 may be a sacrificial gate structure which includes a sacrificial material, such as polysilicon. As a specific example, the height of sacrificial gate material 104 may be approximately 120 nanometers. In the depicted example, the gate stacks 101 include one or more protective layers 106, 108 disposed over the gate structures 104. As an example, first hard mask layer 106 may be a layer of silicon nitride, with (for instance) a thickness of about 40 nanometers, and having been formed by a CVD process. First hard mask layer 106 is protected by second hard mask layer 108. Second hard mask layer 108 may be fabricated of a variety of materials, and be a layer of increased hardness relative to the hardness of the first hard mask layer 106. In one specific embodiment, second hard mask layer 108 may be a layer of oxide, having a thickness of approximately 50 nanometers, which may also have been formed via a CVD process.

Figure 1B:
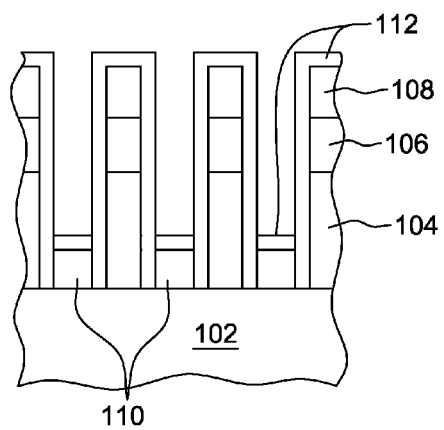
FIG. 1B depicts the intermediate structure of FIG. 1A, after conformal deposition of a protective spacer layer.

As depicted in FIG. 1B, a protective spacer layer 112 is provided over the intermediate structure, including over fins 110, and the gate stacks 101 (including gate structures 104, and the protective hard mask layers 106, 108). Protective spacer layer 112 may be provided via, for instance, a variety of deposition processes, such as chemical-vapor deposition, atomic layer deposition, physical vapor deposition, etc. In one example, the spacer material may include an oxide or silicon nitride.

Figure 1C:
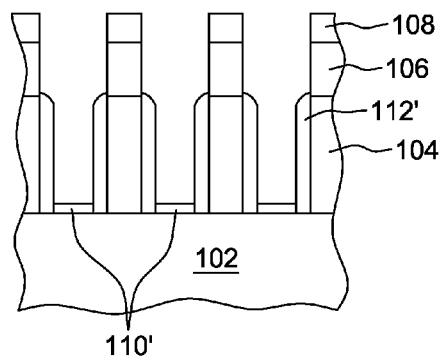
FIG. 1C depicts the intermediate structure of FIG. 1B, after etching of the protective spacer layer from the fins of the structure, and illustrating pull-down of the sidewall spacers along the sacrificial gates.

As illustrated in FIG. 1C, one or more process operations may be performed to remove portions of protective spacer material 112 from, for instance, fins 110, which results in etched-back fins 110', and formation of sidewall spacers 112' over gate structures 104, and along the sidewalls of gate stacks 101. As one illustrative example, etch-back of the protective spacer layer 112 may be performed via an isotropic dry-etch process, such as reactive ion etching using fluorine-based chemistry involving process gases such as tetrafluoromethane ($CF_4$), trifluoromethane ($CHF_3$), sulfur hexafluoride ($SF_6$). As illustrated in FIG. 1C, sidewall spacers 112' are pulled down along the sidewalls of the gate stacks 101, which may be sufficiently significant to result in the formation of nodule defects 116 (see FIG. 1D) in the upper regions of gate structures 104 at the sidewalls thereof during subsequent processing.

For instance, during subsequent conventional gate-last processing, an epitaxial silicon or silicon-germanium process is employed in the fabrication of a semiconductor device, such as a FINFET device, to provide re-grown fins 110" outside the gate stacks 101. This epitaxial processing after protective spacer layer removal from the fins may be employed to define silicon-germanium or silicon-phosphorus fins, which advantageously stress the channels within the gate regions of the transistors. Such an epitaxial process conventionally re-grows the fins outside of the gates.

Figure 1D:
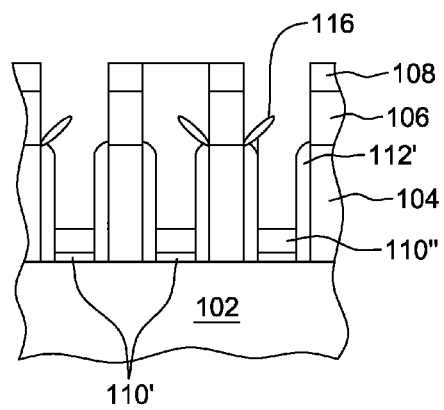
FIG. 1D depicts the intermediate structure of FIG. 1C, after a subsequent epitaxial growth on the fins outside the gate structures, and illustrating potential punch-through of silicon nodules in the pull-down regions of the sidewall spacers.

As illustrated in FIG. 1D, this may result in small nodule defects 116 (for example, islands of polysilicon or silicon nodules) being formed extending from the gate structures due (for instance) to nucleation and growth of polysilicon from the sidewalls of the gate structures, for instance, in the upper regions of the gate structures where the sidewall spacers 112' may be thinnest due to pull-down of the sidewall spacers. In these regions, the sidewall spacers 112' may be too thin to provide sufficient gate structure isolation. The presence of nodule defects 116 can negatively impact subsequent device operation, particularly as critical device dimensions become smaller. Formation of nodule defects 116 is due, at least in part, to the relatively long etch process needed to clear spacer material from the fin sidewalls in a gate-last, FINFET formation process, which results in more severe spacer pull-down on the gate stack sidewalls, than in a planar gate-last FET fabrication approach. By way of example, if the sidewall spacer in the upper portion of the gate structure 104 is degraded to 3 or 4 nanometers or less, then there is a risk of growing nodule defects 116 during the subsequent epitaxial processing of the fins. These nodule defects can result, for instance, in a short between the gate and the source or drain contacts (not shown) to be disposed between the resultant gate structures, and may even remain in place after removal of the sacrificial gate material, for instance, removal of the sacrificial polysilicon. Even if there is no full contact short between the resultant gate structure and the adjacent source or drain contact, performance degradation of the transistor may still result.

To address this issue, disclosed herein is an enhanced, gate-last semiconductor device fabrication approach, wherein better sidewall spacer protection and isolation of the gate structure is provided to, at least in part, prevent nodule defect formation, for instance, during subsequent epitaxial processing. This enhanced sidewall spacer protection for the gate structure may be accomplished for either planar FET devices or FINFET devices. The method includes, in one aspect, fabricating a semiconductor device by providing a gate structure with one or more layers over the gate structure, to define gate stacks having one or more gate sidewalls. The one or more layers may be one or more protective layers, such as one or more hard masks disposed over the gate structure, which itself may be a sacrificial gate structure within an intermediate structure formed during gate-last semiconductor device fabrication processing. By way of example, the sacrificial gate structure may include a sacrificial material, such as polysilicon. The method further includes: selectively removing a portion of the gate structure at or along the at least one gate sidewall to partially undercut the at least one layer over the gate structure; and forming at least one sidewall spacer over the at least one sidewall of the gate structure. A portion of the at least one sidewall spacer at least partially fills the partial undercut of the at least one layer, and resides at least partially below the at least one layer. The selective removing of the portion of the gate structure along the sidewall of the gate structure can be accomplished, in one embodiment, by implanting one or more sidewalls of the gate structure with, for instance, a p-type or an n-type dopant to produce a doped region of the gate structure, and subsequently, at least partially removing the doped region(s) of the gate structure selective to an undoped region of the gate structure to partially undercut the at least one layer over the gate structure.

FIGS. 2A-2E depict one embodiment of such an enhanced, gate-last semiconductor device fabrication approach, in accordance with one or more aspects of the present invention.

Figure 2A:
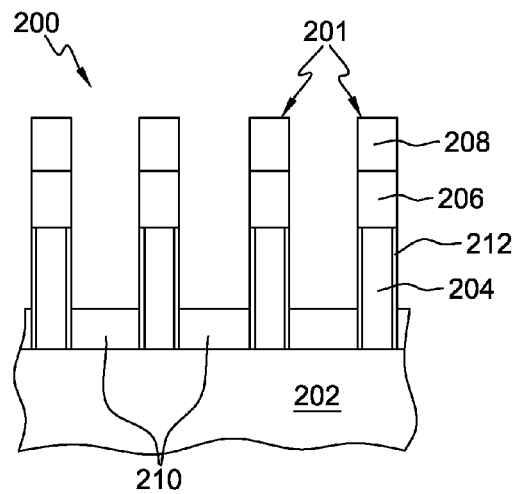
FIG. 2A is a partial elevational view of one embodiment of an intermediate structure obtained, pursuant to an enhanced, gate-last semiconductor device fabrication approach, wherein the sacrificial gate structures are provided with one or more doped regions along one or more sidewalls thereof, in accordance with one or more aspects of the present invention.

FIG. 2A depicts an intermediate structure 200 similar to intermediate structure 100 described above in connection with FIG. 1A, that is, with the exception of doped regions 212 along the sidewalls of gate structures 204. In particular, intermediate structure 200 depicts one example of a structure obtained during gate-last semiconductor device fabrication processing, in accordance with one or more aspects of the present invention. As illustrated, one or more fins 210 are disposed on or projecting from a substrate 202, and one or more gate structures 204 are provided over substrate 202 and extending over the one or more fins 210. In this example, one or more protective layers 206, 208 are disposed over the respective gate structures 204 to form separate gate stacks 201. As discussed above, these one or more layers may include a first hard mask layer 206 and a second hard mask layer 208.

By way of specific example, substrate 202 may be a semiconductor substrate and include, for instance, silicon, and gate structure 204 may be provided using conventional deposition processes, such as chemical-vapor deposition, atomic layer deposition, physical vapor deposition, or a plasma-enhanced version of such processes. By way of example, gate structure 204 may be a sacrificial gate structure formed of a sacrificial gate material, such as conventionally used in replacement metal gate processing. The gate structure 204 may be approximately 120 nanometers in height, similar to the gate structure described above in connection with FIGS. 1A-1D. In this embodiment, however, gate structures 204 may have a width slightly wider than the gate structures of FIGS. 1A-1D to accommodate the doped regions 212. For instance, each doped region 212 may extend 2-3 nanometers into the gate structure from the sidewall thereof, and thus, the width of the gate structures may be 4-6 nanometers wider than in the example described above. In this manner, the width (or thickness) of the resultant replacement gate structures will be approximately the same as currently being provided using a gate-last semiconductor device fabrication approach.

As noted, at the processing stage depicted, the one or more layers 206, 208 over gate structure 204 include a first hard mask 206 and a second hard mask 208. In one embodiment, first hard mask 206 may be a layer of silicon nitride with a thickness of, approximately, 40 nanometers, having been formed via, for instance, a chemical-vapor deposition process. First hard mask layer 206 may be protected by a second hard mask layer 208, which may be formed of a variety of materials, and have an increased hardness relative to the hardness of first hard mask layer 206. By way of specific example, second hard mask layer 208 may be a layer of oxide with a thickness of, for instance, 50 nanometers, and be formed via a chemical-vapor deposition process.

As illustrated in FIG. 2A, one or more sidewalls of one or more gate structures 204 may be implanted with a dopant to create doped regions 212 within the stack structures 201. The dopant employed may be a p-type dopant or an n-type dopant. Note that as used herein, p-type dopant refers to the addition of an impurity to the gate structure (which includes (for example) a sacrificial material formed of an intrinsic semiconductor) to create deficiencies of valence electrons. Examples of a p-type dopant may include boron, aluminum, gallium, or indium, being added to a polysilicon sacrificial material of the gate structure. The n-type dopant refers to the addition of impurities to, for instance, an intrinsic semiconductor material of the gate structure(s), which contribute more electrons to an intrinsic material, and may include (for instance) phosphorus, antimony, or arsenic. In one embodiment, the thickness of the n-type or p-type doped region 212 laterally inward from the respective gate sidewall into the gate structure 204 may be less than 5 nanometers, for instance, 2-3 nanometers each. The doped region may be formed via an angled implantation process.

Figure 2B:
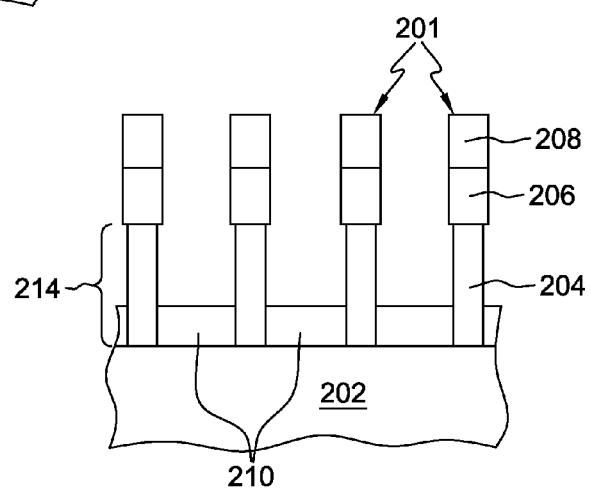
FIG. 2B depicts the intermediate structure of FIG. 2A, after etching of the one or more doped regions at the sidewalls of the sacrificial gate structures, in accordance with one or more aspects of the present invention.

As illustrated in FIG. 2B, doped regions 212 may be selectively removed by a selective etch process to create undercut regions 214 at least partially undercutting the one or more layers 206, 208 over gate structures 204 of gate stacks 201. This partial undercutting of the protective layers (or recessing of the sidewalls of the gate structure) facilitates better spacer isolation of the gate structure in the upper regions of the gate structures, and in particular, at the upper corners of the gate structures, and advantageously inhibits the subsequent creation of one or more nodule defects, such as described above in connection with the process embodiment of FIGS. 1A-1D. The selective etch process may be one or more anisotropic, dry-etch processes employed to partially undercut the protective layers. Reactive ion etching or plasma etching may alternatively be employed in the selective removal process. Note that the removal (or etch) is selective in that, in one embodiment, the doped regions 212 of a gate structure are removed selective to the central, undoped region of the gate structure.

Figure 2C:
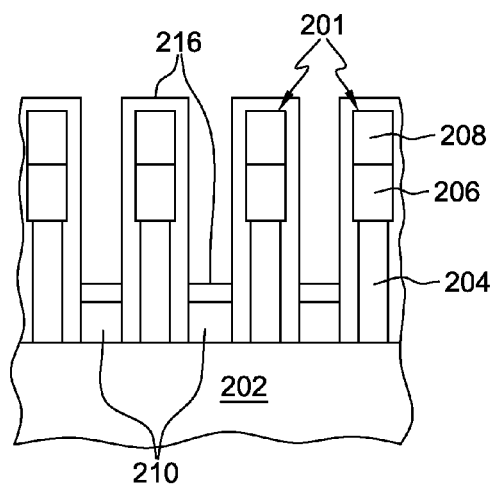
FIG. 2C depicts the structure of FIG. 2B, after provision of a conformal protective spacer layer over the intermediate structure, including over the etched sidewalls of the sacrificial gate structures, in accordance with one or more aspects of the present invention.
Figure 2D:
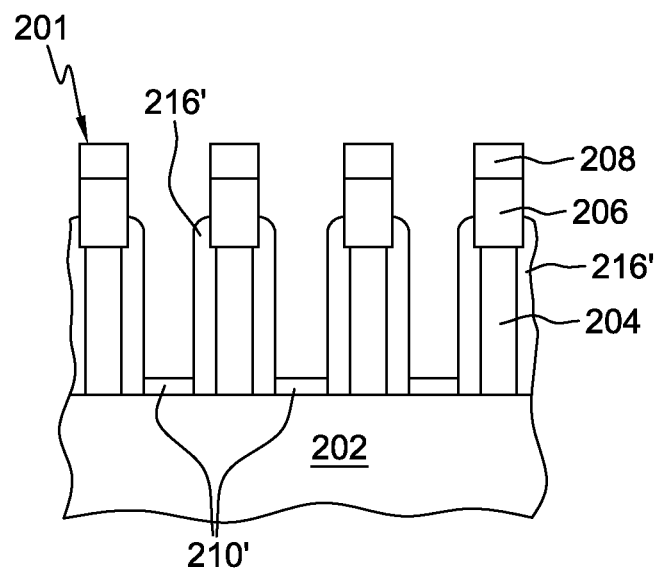
FIG. 2D depicts the structure of FIG. 2C after removal of the conformal protective spacer layer from the fins of the structure, and illustrating the resultant sidewall spacers over the recessed sidewalls of the sacrificial gate structures, in accordance with one or more aspects of the present invention.

As illustrated in FIG. 2C, protective spacer material 216 is deposited over the intermediate structure, including over gate stacks 201 and fins 210 using one or more conventional processes, such as a conformal deposition process. In one example, the protective spacer material 216 may include silicon nitride and be formed using, for instance, a thermal furnace process, or by a chemical-vapor deposition process. As illustrated in FIG. 2C, the protective spacer material 216, in one embodiment, fills the undercut regions 214 of the gate stacks 201 so as to provide thicker spacer material 216 over the sidewalls of the gate structures 204, and thereby provide enhanced protection and isolation in the upper corners of the gate structures, which ensures less susceptibility to nodule defect formation, even with a severe sidewall spacer pull-down, such as illustrated in FIG. 2D. In one embodiment, a silicon nitride layer may be deposited as the protective spacer material 216 using bis-t-butylaminosilane (BT-BAS) with ammonia ($NH_3$) precursors, or dichlorosilane ($SiH_2Cl_2$) with ammonia ($NH_3$) in a CVD reactor. As noted above, the sidewall spacer 216' pull-down may be due to processing to remove the protective spacer material 216 from the fins, resulting in recessed fins 210' within the intermediate structure. This removal of the protective sidewall spacer from the fins may be performed employing a dry, anisotropic etch process. In one illustrative embodiment, for example, an anisotropic dry etching process, such as reactive ion etching using fluorine-based chemistry involving process gases such as tetrafluoromethane ($CF_4$), trifluoromethane ($CHF_3$), sulfur hexafluoride ($SF_6$) may be employed.

Figure 2E:
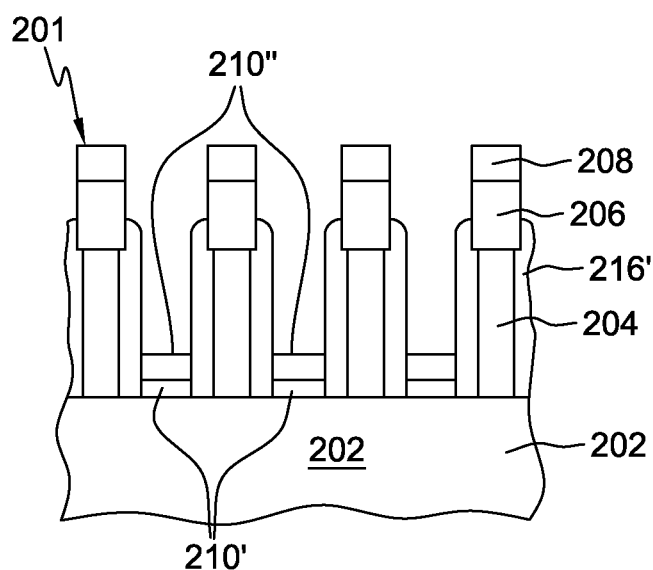
FIG. 2E depicts one embodiment of the sacrificial gate structure of FIG. 2D, after an epitaxial growth on the fins, and illustrating elimination of any punch-through silicon nodule defect, in accordance with one or more aspects of the present invention.

As illustrated in FIG. 2E, epitaxial processing may be employed to reestablish the fins by providing re-grown fin portions 210" over the recessed fins 210'. These re-grown fin portions 210" may include silicon phosphorous or silicon geranium regions which, as noted above, facilitate stressing the unetched fin channels beneath the gate structures 204, and thereby provide enhanced transistor operation. Advantageously, note that the nodule defect formation has been eliminated, even in the case of severe pull-down of sidewall spacers, such as illustrated in FIGS. 2D & 2E.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
    facilitating fabricating a semiconductor device, the facilitating fabricating comprising:
        providing a gate structure over at least one fin with at least one layer over the gate structure, the gate structure comprising at least one sidewall;
        implanting the at least one sidewall with a dopant to form at least one doped region of the gate structure along the at least one sidewall;
        selectively removing at least a portion of the at least one doped region of the gate structure along the at least one sidewall to partially undercut the at least one layer over the gate structure;
        forming at least one sidewall spacer over the at least one sidewall of the gate structure, wherein a portion of the at least one sidewall spacer fills the partial undercut of the at least one layer and has at least a pre-defined minimum thickness, including at the partial undercut of the at least one layer, and wherein the forming comprises:
            disposing a sidewall spacer material conformally over the at least one sidewall of the gate structure and the at least one fin;
            removing the sidewall spacer material from the at least one fin, leaving the at least one sidewall spacer over the at least one sidewall of the gate structure, wherein the removing results in recessing of the at least one fin, and a partial recessing down of the sidewall spacer material along the at least one sidewall of the gate structure; and
        epitaxially growing a material over the at least one fin to reestablish the height of the at least one fin recessed by the removing of the sidewall spacer material, wherein the at least one sidewall spacer having the pre-defined minimum thickness and the at least one layer over the gate structure prevent growth of the material on the gate structure during the epitaxially growing of the material over the at least one fin.

2. The method of claim 1, wherein the selectively removing comprises removing a portion of the at least one doped region of the gate structure selective to an undoped region of the gate structure to partially undercut the at least one layer over the gate structure.

3. The method of claim 2, wherein the removing the at least one doped region of the gate structure further comprises selectively etching the at least one doped region of the gate structure laterally inward from the at least one sidewall.

4. The method of claim 2, wherein the dopant comprises one of a p-type dopant or an n-type dopant.

5. The method of claim 2, wherein a thickness of the at least one doped region laterally inward from the at least one sidewall into the gate structure is 5 nanometers or less.

6. The method of claim 2, wherein the dopant comprises one of boron or phosphorus.

7. The method of claim 6, wherein the removing a portion of the at least one doped region comprises selectively etching the at least one doped region using a nitrogen trifluoride plasma.

8. The method of claim 1, wherein the gate structure comprises multiple sidewalls, wherein the implanting comprises implanting the multiple sidewalls with the dopant to produce multiple doped regions of the gate structure, each doped region being disposed adjacent to a respective sidewall of the multiple sidewalls, and the selectively removing comprises selectively removing multiple portions of the multiple doped regions of the gate structure along the multiple sidewalls to partially undercut the at least one layer at the multiple sidewalls.

9. The method of claim 8, wherein the selectively removing comprises removing portions of the multiple doped regions of the gate structure selective to an undoped region of the gate structure to partially undercut the at least one layer over the gate structure.

10. The method of claim 9, wherein the removing the portions of multiple doped regions of the gate structure further comprises selectively etching the multiple doped regions of the gate structure laterally inward from the multiple sidewalls thereof.

11. The method of claim 10, wherein a thickness of at least one doped region of the multiple doped regions laterally inward from a respective sidewall of the gate structure into the gate structure is 5 nanometers or less.

12. The method of claim 1, wherein the providing comprises providing multiple gate structures, the gate structure being one gate structure of the multiple gate structures, and wherein each gate structure of the multiple gate structures includes a respective at least one layer thereover.

13. The method of claim 12, wherein the implanting comprises implanting the sidewalls of the multiple gate structures with the dopant to produce multiple doped regions of the multiple gate structures, and the selectively removing comprises selectively removing a portion of each doped region of the multiple doped regions of each gate structure of the multiple gate structures along a respective at least one sidewall thereof to partially undercut the respective at least one layer over that gate structure.

14. The method of claim 13, wherein the selectively removing comprises removing portions of the doped regions of the multiple gate structures selective to respective undoped regions thereof to partially undercut the respective at least one layer.

15. The method of claim 14, wherein the removing portions of the doped regions of the multiple gate structures further comprises, for one gate structure, selectively etching one or more doped regions of the one gate structure laterally inward from one or more respective sidewalls of the one gate structure to undercut the respective at least one layer over that one gate structure.

16. The method of claim 15, wherein a thickness of the one or more doped regions of the one gate structure laterally inward form a respective sidewall of the one gate structure into the one gate structure is 5 nanometers or less.

17. The method of claim 1, wherein the at least one sidewall spacer comprises at least one of silicon nitride or an oxide, the at least one layer comprises at least one of silicon nitride or an oxide, and the gate structure comprises a sacrificial gate structure, and wherein the sacrificial gate structure comprises a sacrificial material, the sacrificial material comprising polysilicon.

18. The method of claim 17, wherein the selectively removing comprises removing a portion of the at least one doped region of the gate structure selective to an undoped region of the gate structure to partially undercut the at least one layer.

19. The method of claim 18, wherein the dopant comprises one of a p-type dopant or an n-type dopant.

20. The method of claim 18, wherein the dopant comprises one of boron or phosphorous, and the undoped region comprises the polysilicon.

* * * * *